(12) United States Patent
Slaughter et al.

(10) Patent No.: US 6,544,801 B1
(45) Date of Patent: Apr. 8, 2003

(54) METHOD OF FABRICATING THERMALLY STABLE MTJ CELL AND APPARATUS

(75) Inventors: Jon Slaughter, Tempe, AZ (US); Saied Tehrani, Tempe, AZ (US); Eugene Chen, Gilbert, AZ (US); Mark Durlam, Chandler, AZ (US); Mark DeHerrera, Tempe, AZ (US); Renu Whig Dave, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 139 days.

(21) Appl. No.: 09/642,350

(22) Filed: Aug. 21, 2000

(51) Int. Cl.[7] .................. H01L 21/00; H01L 29/82; G11B 5/127

(52) U.S. Cl. .................. 438/3; 438/653; 257/421; 360/324.2

(58) Field of Search .................. 438/3, 653, 783, 438/785, 971; 257/421, 424, 425, 427; 360/324.2; 205/90

(56) References Cited

U.S. PATENT DOCUMENTS

| | | | | |
|---|---|---|---|---|
| 4,825,325 A | * | 4/1989 | Howard ................. | 360/327.32 |
| 5,258,884 A | * | 11/1993 | Howard et al. ......... | 360/327.22 |
| 5,268,806 A | * | 12/1993 | Goubau et al. ......... | 360/322 |
| 5,348,894 A | * | 9/1994 | Gnade et al. ............ | 438/396 |
| 5,496,759 A | * | 3/1996 | Yue et al. ............... | 438/3 |
| 5,636,093 A | * | 6/1997 | Gijs et al. .............. | 360/126 |
| 5,712,612 A | * | 1/1998 | Lee et al. ............... | 338/32 R |
| 5,764,567 A | * | 6/1998 | Parkin ................... | 365/173 |
| 5,768,181 A | * | 6/1998 | Zhu et al. .............. | 365/158 |
| 5,804,250 A | * | 9/1998 | Yang ..................... | 427/130 |
| 5,949,622 A | * | 9/1999 | Kamiguchi et al. .... | 360/324.12 |
| 5,953,248 A | * | 9/1999 | Chen et al. ............. | 365/158 |
| 6,120,842 A | * | 9/2000 | Lu et al. ................. | 429/99 |
| 6,166,948 A | * | 12/2000 | Parkin et al. ........... | 365/173 |
| 6,178,074 B1 | * | 1/2001 | Gill ....................... | 360/313 |
| 6,180,444 B1 | * | 1/2001 | Gates et al. | |
| 6,195,240 B1 | * | 2/2001 | Gill ....................... | 360/324.11 |
| 6,275,363 B1 | * | 8/2001 | Gill ....................... | 360/324.2 |
| 6,392,922 B1 | * | 5/2002 | Liu et al. ................ | 257/421 |

* cited by examiner

Primary Examiner—Matthew Smith
Assistant Examiner—Lex H. Malsawma
(74) Attorney, Agent, or Firm—William E. Koch

(57) ABSTRACT

An MTJ cell including an insulator layer of material between magnetic material layers with the insulator layer of material having a greater attraction for a third material than the magnetic material layers. The third material is introduced to one or both so that when the cell is heated the third material is redistributed from the magnetic material layer to the insulator layer. Upon redistribution the insulator layer becomes an insulator layer material. Also, a first diffusion barrier layer is positioned between a first metal electrode and one of the magnetic material layers and/or a second diffusion barrier layer is positioned between a second metal electrode and the other magnetic material layer to prevent diffusion of the metal in the electrodes into the magnetic material layers.

50 Claims, 2 Drawing Sheets

METHOD OF FABRICATING THERMALLY STABLE MTJ CELL AND APPARATUS

FIELD OF THE INVENTION

This invention relates to methods of fabricating MTJ cells with better thermal endurance and with improved temperature stability.

BACKGROUND OF THE INVENTION

Magnetic random access memory (MRAM) devices are based on the integration of semiconductor circuits with magnetic tunneling junction (MTJ) type of magnetic material. Additional information as to the fabrication and operation of MTJ cells can be found in U.S. Pat. No. 5,702,831, entitled "Multi-Layer Magnetic Tunneling Junction Memory Cells", issued Mar. 31, 1998, and incorporated herein by reference. Normal semiconductor processing sometimes requires processing temperatures as high as 400° C. or above. Materials presently used in MTJ cells are typically not stable above 300° C. and cannot withstand these high temperatures without substantial damage or degradation of the operating characteristics. It is thus desirable to have MTJ material that endures these kinds of high processing temperatures. Otherwise low temperature special processing modules may have to be developed. In some special circumstances this may be feasible. But it definitely increases the cost of producing the MRAM chips or devices if special low temperature processing modules are required.

Also, depending on when the MTJ layer can be inserted in the normal CMOS flow, the size of the memory cell is different. The earlier in the CMOS flow the MTJ layer can be inserted, the smaller the size of the memory cell, since the minimum dimension becomes larger as the number of layers in the CMOS process increases. Thus, it is desirable to have thermally endurable MTJ material that can be inserted earlier in a CMOS flow, so that memory cell size can be smaller. With smaller cell size, the memory density will be higher and the memory will cost less.

A further problem with the integration of MTJ cells with semiconductor circuits in normal semiconductor manufacturing processes, such as CMOS and the like, is the diffusion of common metal electrodes, such as aluminum and aluminum alloy metals, into the magnetic layers during the high heat steps of the process. Upon diffusion of the aluminum into the magnetic layers, operating characteristics of the MTJ cell can be substantially reduced or the cell can be completely inoperative. Many applications of MTJ cells, including memory cells, field sensors, such as disk read heads, and other magnetic-electronic hybrid systems, would benefit from improved MTJ thermal endurance.

Accordingly it is highly desirable to provide a method of fabricating MTJ cells with better thermal endurance and with improved temperature stability, and to provide the resulting apparatus.

BRIEF DESCRIPTION OF THE DRAWINGS

Referring to the drawings.

DESCRIPTION OF THE PREFERRED EMBODIMENTS

Figure 1:
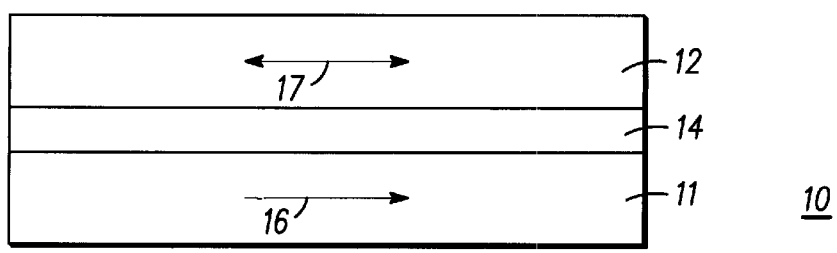
FIG. 1 is a simplified sectional view of a MTJ cell.

Turning now to the figures and specifically to FIG. 1, a simplified sectional view of a magnetic tunneling junction (MTJ) cell 10 is illustrated to briefly describe the operation of a MTJ cell. MTJ cell 10 includes a pair of layers 11 and 12 of magnetic material. Layers 11 and 12 have a layer 14 of insulator material sandwiched therebetween. As is known in the art, layers 11 and 12 are each generally formed of a plurality of layers of magnetic material, such as cobalt (Co), nickel (Ni), iron (Fe), and the like. Layer 14 is formed of some nonconductive material such as aluminum oxide, aluminum nitride, or the like.

One of the layers of magnetic material, layer 11 in this description, has a larger switching field so that its magnetic vector, represented by arrow 16, hereinafter vector 16, is always pointed in the same direction when the applied magnetic field is less than its switching field. The magnetic vector of layer 12, represented by arrow 17, hereinafter vector 17, has a smaller switching field and is free, but constrained by the physical size of layer 12, to point in either of two directions when the applied magnetic field is larger than its switching field. Cell 10 is used by connecting it in a circuit such that electricity flows vertically through cell 10 from one of the layers 11 or 12 to the other. Cell 10 can be electrically represented as a resistor and the size of the resistance depends upon the orientation of magnetic vectors 16 and 17. As is understood by those skilled in the art, cell 10 has a relatively high resistance when magnetic vectors 16 and 17 are misaligned (point in opposite directions) and a relatively low resistance when magnetic vectors 16 and 17 are aligned.

It is of course desirable to have the high resistance (misaligned vectors 16 and 17) much higher than the low resistance (aligned vectors 16 and 17) so that the change can be easily detected in associated electronic circuitry. The difference between the high and low resistance is generally referred to as the magneto resistance (MR) with the difference generally being expressed in a percent (%), hereinafter the MR %.

In the present practice of manufacturing MTJ cells, or arrays of cells, the procedure is generally as follows. Bottom contact metal is deposited on a supporting substrate. Multilayers, including the bottom layer of magnetic material and a thin layer of aluminum, are deposited on the bottom contact metal. The aluminum metal is then oxidized to form the insulator layer. A top layer of magnetic material and top contact metal are then deposited on the oxidized aluminum. The problem is that one or more high heating steps (i.e., 400° C. or above) may be required to process semiconductor circuits associated with the MTJ cell array. These high heating steps result in substantial degradation of the cell's properties and performance.

The degradation of the cell under high heat is believed to occur because of diffusion of other metal or metals to the magnetic layer/insulator layer interface and with the eventual oxidation of the magnetic layers next to the insulator layer. Oxidized magnetic material or magnetic material with impurities has very poor magnetic polarization which substantially affects the MR %. It has been found in some instances that the MTJ cells produced in accordance with the above process have little or no MR % and are virtually useless after going through 350° C. to 400° C. processes.

To produce an MTJ cell with thermal endurance, that is one that can withstand subsequent high temperature thermal processing, the following procedure has been developed.

Figure 2:
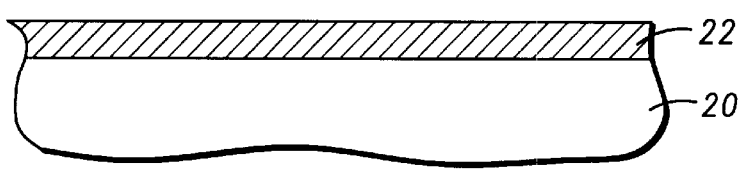
FIG. 2 through FIG. 5 illustrate sequential steps in the manufacture of an MTJ cell in accordance with the present invention.

Turning now to FIG. 2, a supporting substrate 20 is provided which may be, for example, a semiconductor substrate or the like. A lower or bottom metal electrode 22 is deposited on the surface of substrate 20 in any well known manner. In many applications metal electrode 22 may be part of a metallization step in the processing of associated semiconductor circuits. As will be explained in more detail below, metal electrode 22 may include various layers (or sub-layers) of material used to optimize the deposition process. However, to simplify this description only a single layer is illustrated and described at this time.

Figure 3:
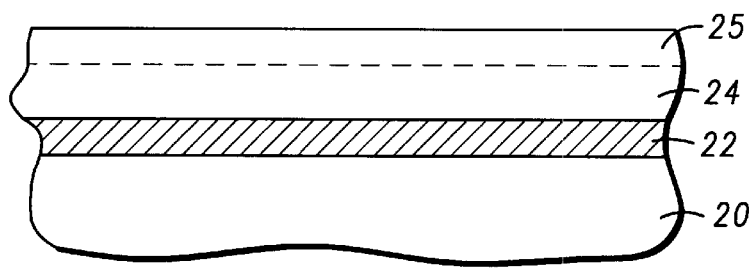

Turning now to FIG. 3, a layer 24 of magnetic material is deposited on the upper surface of metal electrode 22. It will of course be understood that layer 24 of magnetic material may again include multiple layers of magnetic material specifically designed to improve the magnetic properties and qualities of the final cell. However, since these features are not a part of this invention and since the invention will operate with one or more layers (or sub-layers) of magnetic material, a single layer is illustrated for simplicity. In this embodiment, an upper portion 25 (indicated by a broken line) of layer 24 is oxidized by some convenient method, such as plasma oxidation, oxidation stimulated by UV light, reactive sputtering, oxidation with atomic oxygen, natural oxidation or the like. Here it should be noted that materials other than oxygen are used with a base material to produce the required insulator layer and all such materials are included herein with oxygen being used only for purposes of example. For example, nitrogen can be used to produce a nitride, rather than the use of oxygen to produce an oxide.

Figure 4:
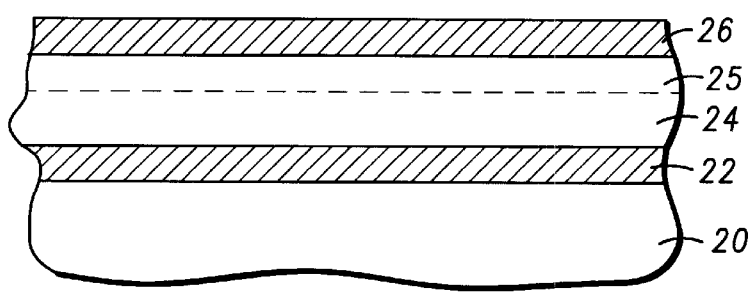

Turning to FIG. 4, a layer 26 of aluminum metal is deposited on the surface of layer 24. It will be understood by those skilled in the art that aluminum metal is used in this example because it has a very high usage in integrated circuits and the like. It will further be understood that other base materials may be used which can be incorporated with materials such as oxygen and nitrogen to produce the insulator layer and all such base materials are included herein. Optionally and depending upon the amount of oxygen introduced into layer 24 and other layers to be described, layer 26 of aluminum can be partially oxidized at this point. It should be understood, however, that even with the introduction of some oxygen to layer 26, the aluminum metal of layer 26 should be oxygen deficient. That is, all of the aluminum metal of layer 26 is not oxidized to the stoichiometry of $Al_2O_3$, but rather to $Al_2O_x$ where x<3.

Figure 5:
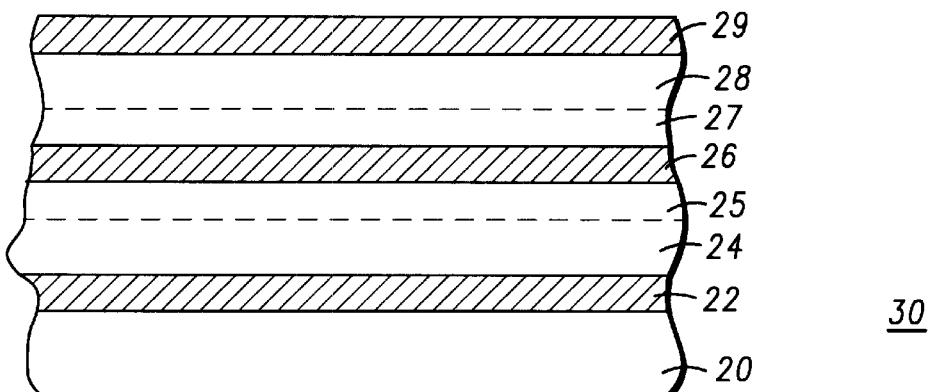

Referring now to FIG. 5, a thin layer of magnetic material, designated 27 and depicted with a broken line, is deposited on layer 26 and oxidized by any convenient method (see above). After the oxidation, the remainder of magnetic material is deposited to form an upper layer 28 of magnetic material. A top metal electrode 29 is deposited on layer 28 to complete an MTJ structure 30. Again, as described above, in many applications metal electrode 29 may be part of a metallization step in the processing of associated semiconductor circuits. Here it should be understood that the process described is a simplified version and may include many additional steps, such as the formation of connecting lines, bit lines, etc. Further, MTJ cells are generally produced in relatively large arrays and the process described may include steps for producing the entire array with additional masking and etching steps to divide the blanket depositions into individual cells being omitted for convenience.

The non-heat treated. MTJ structure 30 described above will have near zero MR % because the oxidized magnetic layers 24 and 28 have near zero magnetic polarization, leading to near zero MR %. When MTJ structure 30 is heated in subsequent processing steps, the oxygen deficient aluminum (or $AlO_x$) has a greater tendency (a more negative enthalpy of formation or higher affinity) to attract the oxygen residing in upper portion 25 of layer 24 and the lower portion 27 of layer 28 so that oxygen is taken from magnetic layers 24 and 28 to oxidize layer 26 completely and form the insulator layer (tunnel barrier material). The amount of oxygen in magnetic layers 24 and 28, and layer 26 if included, and the processing time at 400° C. and above are controlled such that after the processing at 400° C. and above is completed substantially all of the oxygen in magnetic layers 24 and 28 has been absorbed into aluminum layer 26.

Here it should be noted that the present process can be very accurately controlled because all or any part of either or both magnetic layers 24 and 28 can be initially oxidized to provide the amount of oxygen required to oxidize aluminum layer 26. Further, layer 26 can be partially oxidized if, for example, following process steps include very short times at high temperatures. The amount of oxygen and position of the oxygen relative to layer 26 can be accurately controlled to ultimately provide MTJ structure 30 with little or no oxygen in the magnetic layers and a completely or nearly completely oxidized barrier layer. Thus, MTJ structure 30 survives subsequent high temperature processing steps, and has an optimal MR % at the end of the processing.

An MTJ magnetic storage element for MRAM purposes is generally formed by depositing a conductive base metal layer (e.g., a metallization step in a semiconductor fabrication process), followed by a bottom electrode which contains seed and template layers, followed by one or more magnetic layers, followed by an insulator layer, followed by a top electrode containing at least one magnetic layer, followed by a conductive top metal layer (e.g., another metallization step in a semiconductor fabrication process). Upon heating, as for example annealing or activation steps in the semiconductor fabrication process, one failure mechanism of the MTJ structure is diffusion of materials used in the conductive base and top metal layers into the top and bottom electrodes. Important materials used in the electrodes, such as cobalt (Co), nickel (Ni), iron (Fe), and ruthenium (Ru), are prone to alloy formation with some metal electrodes, e.g., aluminum, and are known to diffuse into copper (Cu) as well. Since aluminum and copper are used very extensively in metallization steps of semiconductor fabrication, this alloying becomes a serious problem.

Figure 6:
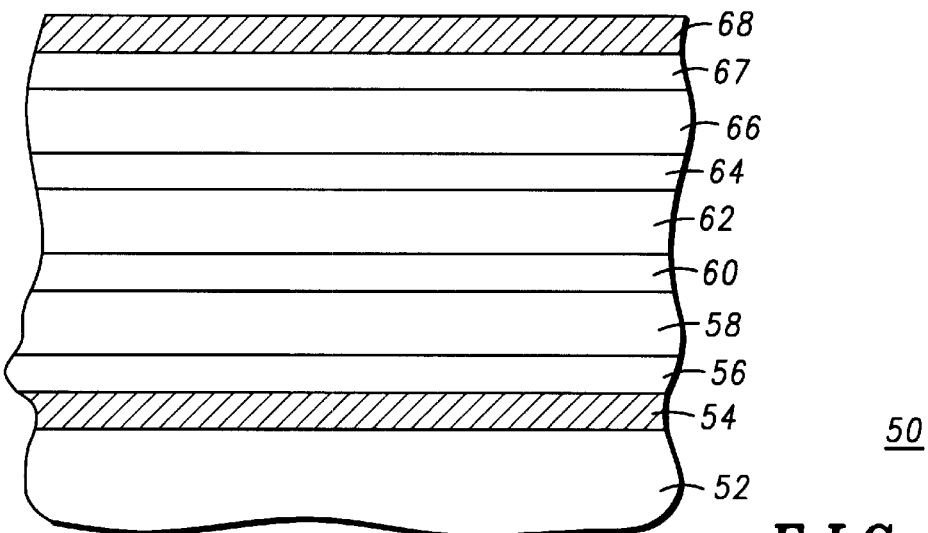
FIGS. 6 and 7 are simplified sectional views of an MTJ cell including further steps in a fabrication process in accordance with the present invention.

Referring specifically to FIG. 6, a simplified sectional view is illustrated of an MTJ magnetic element 50 in accordance with the present invention. Element 50 is formed on a supporting substrate 52, which may be, for example, a semiconductor substrate or the like and may include associated transistors and other control electronics (not shown). A base electrode 54 is formed on the surface of substrate 52 and may include several layers, as will be explained in more detail presently. An antiferromagnetic pinning layer 56, such as IrMn, is formed on electrode 54 and a magnetic layer 58, which has a magnetic vector pinned in a fixed orientation by layer 56, is deposited on layer 56. A layer 60 is formed on layer 58 and a magnetic layer 62 is formed on layer 60. Layer 60 is typically formed of ruthenium or one of several other non-magnetic metals known to have the property of producing a coupling between magnetic layers 58 and 62 that oscillates between antiferromagnetic (AF) and ferromagnetic (FM) depending on the thickness of the layer. Layer 58 is referred to as the pinned layer, layer 60 the spacer layer, and layer 62 the fixed layer. Typically the thickness of spacer layer is chosen in the 5 Å to 10 Å range, corresponding to the first-order AF peak, which makes layer 58 and 62 couple strongly in opposite directions. This configuration has advantages in optimizing the magnetic response of the magnetic element. See, for example, U.S. Pat. No. 6,292,389 issued to Chen on Sep. 18, 2001. Having a very thin spacer layer 60, in the 5 Å to 10 Å range, results in poor thermal endurance because the layer's structure degrades and the coupling begins to have a FM component when heated above 300° C. This problem, in addition to the alloying problem described briefly above, also must be corrected to provide improved thermal stability and endurance. An insulator layer 64 is formed on the surface of magnetic layer 62 and a magnetic layer 66 is formed on barrier 64. In this preferred embodiment, magnetic layers 58, 62, and 66 include CoFe as the magnetic material, although other materials may be used if preferred. Also, aluminum oxide is the preferred material that forms insulator layer 64. The stack which makes up element 50 is completed by depositing a top electrode 68 on magnetic layer 66 or, optionally, including a diffusion barrier layer 67 between layers 66 and 68. Diffusion barrier layer 67 can be formed of a material such as $AlO_x$ or $TaN_x$, as will be explained in more detail presently. Layer 60 is typically formed of ruthenium or one of several other non-magnetic metals known to have the property of producing a coupling between magnetic layers 58 and 62 that oscillates between antiferromagnetic (AF) and ferromagnetic (FM) depending on the thickness of the layer. Layer 58 is referred to as the pinned layer, layer 60 the spacer layer, and layer 62 the fixed layer. Typically the thickness of spacer layer is chosen in the 5 Å to 10 Å range, corresponding to the first-order AF peak, which makes layer 58 and 62 couple strongly in opposite directions. This configuration has advantages in optimizing the magnetic response of the magnetic element as previously disclosed in a copending U.S. Patent Application entitled "Magnetic Element with Improved Field Response and Fabrication Method Therefor", filed Oct. 21, 1999, with Ser. No. 09/422,447 assigned to the same assignee, and incorporated herein by reference. Having a very thin spacer layer 60, in the 5 Å to 10 Å range, results in poor thermal endurance because the layer's structure degrades and the coupling begins to have a FM component when heated above 300° C. This problem, in addition to the alloying problem described briefly above, also must be corrected to provide improved thermal stability and endurance. An insulator layer 64 is formed on the surface of magnetic layer 62 and a magnetic layer 66 is formed on barrier 64. In this preferred embodiment, magnetic layers 58, 62, and 66 include CoFe as the magnetic material, although other materials may be used if preferred. Also, aluminum oxide is the preferred material that forms insulator layer 64. The stack which makes up element 50 is completed by depositing a top electrode 68 on magnetic layer 66 or, optionally, including a diffusion barrier layer 67 between layers 66 and 68. Diffusion barrier layer 67 can be formed of a material such as $AlO_x$ or $TaN_x$, as will be explained in more detail presently.

Figure 7:
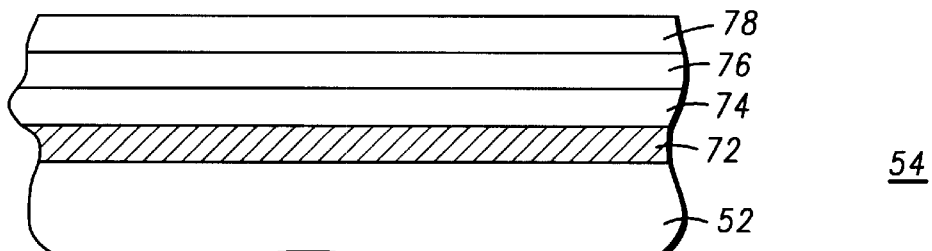

As explained briefly above, a problem occurs when subsequent high temperature processing steps are performed which cause metal or metals in the base electrode and/or the top electrode to alloy with some of the magnetic layers. Referring additionally to FIG. 7, to overcome this problem, a diffusion barrier layer 74 is formed on the upper surface of metallization layer 72. In this preferred embodiment, diffusion barrier layer 74 includes stable compounds such as tantalum oxide, tantalum nitride, or aluminum oxide, aluminum nitride, etc. While tantalum oxide, aluminum oxide, and aluminum nitride are generally non-conducting materials, if layer 74 is formed very thin, such that its resistance is small compared to the insulator layer resistance (layer 64) a diffusion barrier is formed without substantially affecting the operation of magnetic element 50. Generally, it has been found that layer 74 operates efficiently when it is formed thinner than insulator layer 64 if the same material as the insulator layer is used. Further, layer 64 must be very smooth to allow deposition of magnetic material thereon and amorphous or very small crystallite material is preferred for low roughness. In a specific example, insulator layer 64 is formed of aluminum oxide approximately 7 Å to 20 Å thick and layer 74 is formed of tantalum nitride approximately five to one hundred angstroms thick. A preferred method of making a thin and smooth tantalum nitride diffusion barrier is to deposit a metallic Ta layer, 10 Å to 40 Å thick, on the upper surface of metallization layer 72 and then exposing the Ta layer to nitrogen ions or radicals. This method produces a thin diffusion barrier that is more effective than much thicker conventional barriers made by reactive sputtering.

In the embodiment illustrated in FIG. 7, a seed layer 76 is formed on the upper surface of diffusion barrier layer 74 and a template 78 is formed on the upper surface of seed layer 76. It will of course be understood that layers 76 and 78 are optional and in this description are included as a portion of base electrode 54 if included. In general, diffusion barrier layer 74 is positioned between the metal electrode 72 and the next layer of magnetic material, in this embodiment layer 56. In this fashion diffusion barrier layer 74 prevents the alloying or diffusing of the metal in layer 72 with the magnetic material in layers 56 and 58 during subsequent high temperature processing steps.

Top electrode 68 may be formed somewhat similar to base electrode 54 with a diffusion barrier layer above and/or below, except that seed and template layers are generally not included. In some fabrication processes it may be relatively easy to arrange the process so that high temperature steps are all performed prior to the deposition of top electrode 68. In such instances, upper diffusion barrier layer 67 between top electrode 68 and magnetic layer 66 may be optional. Some limited alloying can occur under some relatively normal temperatures and it may be desirable to incorporate a diffusion barrier layer to prevent even this limited alloying. Also, in some embodiments and in some fabrication processes either the associated electronics or additional electronics may be fabricated after magnetic element 50. In such instances it may be desirable to form one or more diffusion barrier layers in top electrode 68 in addition to or instead of the diffusion barrier layers in base electrode 54. Again, upper diffusion barrier layer 67 or layers are positioned between the metal layers in top electrode 68 and the next layer of magnetic material, in this embodiment layer 66.

If layers 60 and 62 are included, the thickness of layer 60 is chosen to correspond to the second AF peak rather than the first peak as described previously. The thickness of layer 60 will then be in the 12 Å to 22 Å range, rather than 5 Å to 10 Å as would be the case for a typical first-order structure. A structure with the thicker layer 60, as described, will continue to function after heating to temperatures greater than 350° C. while a first-order structure with the thinner layer 60 will fail and cease to provide full AF coupling between layers 58 and 62. For the second-order AF coupling between layers 58 and 62 to be sufficiently strong, the growth of the three layers 58, 60, and 62 is seeded to have a strong (111) orientation in the case of FCC materials or (001) in the case of HCP materials and the magnetic layers preferably include Co and Fe. Optional seed layer 76 and optional template layer 78 are chosen to seed the proper film growth to achieve the desired orientation. With some choices of AF pinning material for layer 56, such as FeMn, TaN, diffusion barrier layer 74 will seed the proper orientation without the need for seed layer 76 and template layer 78.

Thus, a fabrication method and apparatus are disclosed wherein one or more diffusion barrier layers are positioned between one or both of the base metal electrode and the adjacent layer of magnetic material and between the top metal electrode and the adjacent layer of magnetic material during the step of forming the stack of layers. The diffusion barrier layer or layers prevent diffusion or alloying of the metal with the adjacent layer of magnetic material during subsequent high temperature and provides improved thermal stability for a magnetic element, such as an MTJ cell. By using properly-oriented CoFe alloys for the pinned and fixed layers, a thick spacer layer operating on the second-order AF coupling peak will provide strong AF coupling and improved thermal stability. Further, because of the improved thermal stability more standard semiconductor processes can be used in conjunction with the MRAM process, which simplifies the overall process, reduces the cost, and allows the fabrication of smaller MRAM devices.

The combination of the thermally endurable MTJ and the thermally stable MTJ described above substantially improves manufacturing processes and allows easier integration of the MRAM structure with associated semiconductor circuits. This easier integration results in substantially lower processing costs. Further, because of the thermally endurable MTJ and the thermally stable MTJ, earlier insertion of the MTJ structure into the semiconductor (CMOS) process flow results in higher density MTJ structures (i.e., smaller memory cell size) and lower cost per bit.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating an MTJ cell comprising the steps of:
    forming a stack of layers of material including a first metal electrode, a first layer of magnetic material in electrical communication with the first metal electrode, an insulator layer of material, a second layer of magnetic material, and a second metal electrode in electrical communication with the second layer of magnetic material;
    the step of forming the stack of layers of material including the steps of:
        positioning the insulator layer of material on the first layer of magnetic material, the insulator layer of material having a greater attraction for a third material than the first layer of magnetic material and the insulator layer of material forming insulator layer material with the third material;
        positioning the second layer of magnetic material on the insulator layer of material, the insulator layer of material having a greater attraction for the third material than the second layer of magnetic material; and
        introducing the third material to one of the first layer of magnetic material and the second layer of magnetic material during the steps of positioning the insulator layer of material on the first layer of magnetic material, and positioning the second layer of magnetic material on the insulator layer of material;
    positioning at least one diffusion barrier layer in accordance with at least one of: between the first metal electrode and the first layer of magnetic material; and between the second metal electrode and the second layer of magnetic material during the step of forming the stack of layers wherein the diffusion barrier layer includes a metallization layer and wherein the diffusion barrier layer is formed by exposing the metallization layer to ions or radicals; and
    heating the stack of layers to redistribute the third material from the one of the first layer of magnetic material and the second layer of magnetic material to the insulator layer of material.

2. A method of fabricating an MTJ cell as claimed in claim 1 wherein the step of positioning the insulator layer of material includes positioning a layer comprising aluminum.

3. A method of fabricating an MTJ cell as claimed in claim 1 wherein the steps of providing the first layer of magnetic material and positioning the second layer of magnetic material both include using magnetic material with no nickel alloys.

4. A method of fabricating an MTJ cell as claimed in claim 1 wherein the step of introducing the third material includes introducing one of oxygen and nitrogen.

5. A method of fabricating an MTJ cell as claimed in claim 1 wherein the step of introducing the third material to one of the first layer of magnetic material and the second layer of magnetic material includes introducing the third material to both of the first layer of magnetic material and the second layer of magnetic material.

6. A method of fabricating an MTJ cell as claimed in claim 1 including in addition a step of introducing the third material to the insulator layer of material so as to leave the insulator layer of material deficient in the third material.

7. A method of fabricating an MTJ cell as claimed in claim 1 wherein the step of introducing the third material includes one of plasma oxidation, oxidation stimulated by UV light, reactive sputtering, oxidation with atomic oxygen, and natural oxidation.

8. A method of fabricating an MTJ cell as claimed in claim 1 wherein the step of heating includes heating to a temperature of at least 350° C.

9. A method of fabricating an MTJ cell as claimed in claim 1 wherein the step of positioning the diffusion barrier layer includes positioning a first diffusion barrier layer between the first metal electrode and the first layer of magnetic material and a second diffusion barrier layer between the second metal electrode and the second layer of magnetic material.

10. A method of fabricating an MTJ cell as claimed in claim 1 wherein the step of positioning the diffusion barrier layer includes forming the metallization layer with tantalum.

11. A method of fabricating an MTJ cell as claimed in claim 1 wherein the step of positioning the diffusion barrier layer includes forming the diffusion barrier layer of material similar to the insulator layer material and the diffusion barrier layer is formed thinner than the insulator layer.

12. A method of fabricating an MTJ cell as claimed in claim 1 wherein the step of forming the stack of layers of material including the first layer of magnetic material further includes a step of forming a first CoFe layer, positioning a nonmagnetic spacer layer on the first CoFe layer, and positioning a second CoFe layer on the spacer layer, the spacer layer being formed with a thickness in the range of 12 Å to 22 Å such that the first and second CoFe layers are coupled antiferromagnetically having magnetic moments in substantially opposite directions when no external magnetic field is applied.

13. A method of fabricating an MTJ cell comprising the steps of:

providing a first metal electrode;

positioning a first diffusion barrier layer on the first metal electrode wherein the first diffusion barrier layer is formed by exposing a first metallization layer to ions or radicals of nitrogen;

positioning a first layer of magnetic material in electrical communication with the first metal electrode so that the first diffusion barrier layer is positioned between the first metal electrode and the first layer of magnetic material;

positioning an insulator layer of material on the first layer of magnetic material;

positioning a second layer of magnetic material on the insulator layer of material; and positioning a second diffusion barrier layer on the second layer of magnetic material and in electrical communication with a second metal electrode so that the second diffusion barrier layer is positioned between the second metal electrode and the second layer of magnetic material wherein the second diffusion barrier layer is formed by exposing a second metallization layer to ions or radicals of nitrogen.

14. A method of fabricating an MTJ cell as claimed in claim 13 wherein the step of positioning the insulator layer of material includes positioning a layer comprising aluminum.

15. A method of fabricating an MTJ cell as claimed in claim 13 wherein the steps of providing the first layer of magnetic material and positioning the second layer of magnetic material both include using nickel free magnetic material.

16. A method of fabricating an MTJ cell as claimed in claim 13 further including a step of introducing a third material into one of the first and second layers of magnetic material, the third material being such that the insulator layer of material has a greater tendency to attract the third material than the first and second layers of magnetic material, and a step of heating, subsequent to the step of positioning the second layer of magnetic material, so that the third material and the insulator layer of material form an insulator layer.

17. A method of fabricating an MTJ cell as claimed in claim 16 wherein the step of introducing the third material includes introducing one of oxygen and nitrogen.

18. A method of fabricating an MTJ cell as claimed in claim 16 wherein the step of introducing the third material to one of the first layer of magnetic material and the second layer of magnetic material includes introducing the third material to both of the first layer of magnetic material and the second layer of magnetic material.

19. A method of fabricating an MTJ cell as claimed in claim 16 including in addition a step of introducing the third material to the insulator layer of material so as to leave the insulator layer of material deficient in the third material.

20. A method of fabricating an MTJ cell as claimed in claim 16 wherein the step of introducing the third material includes one of plasma oxidation, oxidation stimulated by UV light, reactive sputtering, oxidation with atomic oxygen, and natural oxidation.

21. A method of fabricating an MTJ cell as claimed in claim 13 wherein the steps of positioning the first and second diffusion barrier layers include forming the first and second diffusion barrier layers of material similar to the insulator layer material and the diffusion barrier layers are formed thinner than the insulator layer.

22. A method of fabricating an MTJ cell as claimed in claim 13 wherein the step of positioning the first layer of magnetic material further includes a step of forming a first CoFe layer, positioning a nonmagnetic spacer layer on the first CoFe layer, and positioning a second CoFe layer on the spacer layer, the spacer layer being formed with a thickness in the range of 12 Å to 22 Å such that the first and second CoFe layers are coupled antiferromagnetically having magnetic moments in substantially opposite directions when no external magnetic field is applied.

23. A method of fabricating an MTJ cell as claimed in claim 13 wherein the step of heating includes heating to a temperature of at least 350° C.

24. A method of fabricating an MTJ cell as claimed in claim 13 wherein the step of positioning the first diffusion barrier layer between the first metal electrode and the first layer of magnetic material includes using tantalum to form the first metallization layer.

25. A method of fabricating an MTJ cell as claimed in claim 24 wherein the step of using tantalum to form the first metallization layer includes the steps of depositing a layer of tantalum with a thickness less than approximately 50Å.

26. A method of fabricating an MTJ cell as claimed in claim 13 wherein the step of positioning the second diffusion barrier layer between the second metal electrode and the second layer of magnetic material includes using tantalum to form the second metallization layer.

27. A method of fabricating an MTJ cell as claimed in claim 26 wherein the step of using tantalum to form the second metallization layer includes the steps of depositing a layer of tantalum with a thickness less than approximately 50 Å.

28. A method of fabricating an MTJ cell comprising the steps of:

providing a first layer of magnetic material;

positioning an insulator layer of material on the first layer, the insulator layer of material having a greater tendency to attract a third material than the first layer of magnetic material, and the insulator layer of material forming insulator layer material with the third material;

positioning a second layer of magnetic material on the insulator layer of material, the insulator layer or material having a greater Lendency to attract the third material than the second layer of magnetic material;

during the steps of providing the first layer, positioning the insulator layer of material on the first layer, and positioning the second layer of magnetic material on the insulator layer of material, introducing the third material to one of the first layer of magnetic material and the second layer of magnetic material;

positioning a diffusion barrier layer on at least one of the first and second layer of magnetic material wherein the diffusion barrier layer is formed by exposing a metallization layer to ions or radicals and wherein the metallization layer includes at least one of Ta and Al; and heating the first layer of magnetic material, the insulator layer of material, and the second layer of magnetic material to redistribute the third material from the one of the first layer of magnetic material and the second layer of magnetic material to the insulator layer of material.

29. A method of fabricating an MTJ cell as claimed in claim 28 wherein the step of positioning the insulator layer of material includes positioning a layer comprising aluminum.

30. A method of fabricating an MTJ cell as claimed in claim 28 wherein the steps of providing the first layer of magnetic material and positioning the second layer of magnetic material both include using nickel free magnetic material.

31. A method of fabricating an MTJ cell as claimed in claim 28 wherein the step of introducing the third material includes introducing one of oxygen and nitrogen.

32. A method of fabricating an MTJ cell as claimed in claim 28 wherein the step of introducing the third material to one of the first layer of magnetic material and the second layer of magnetic material includes introducing the third material to both of the first layer of magnetic material and the second layer of magnetic material.

33. A method of fabricating an MTJ cell as claimed in claim 28 including in addition a step of introducing the third material to the insulator layer of material so as to leave the insulator layer of material deficient in the third material.

34. A method of fabricating an MTJ cell as claimed in claim 28 wherein the step of introducing the third material includes one of plasma oxidation, oxidation stimulated by UV light, reactive sputtering, oxidation with atomic oxygen, and natural oxidation.

35. A method of fabricating an MTJ cell as claimed in claim 28 wherein the step of heating includes heating to a temperature of at least 350° C.

36. A method of fabricating an MTJ cell comprising the steps of:

forming a stack of layers of material including a first metal electrode, a first layer of magnetic material in electrical communication with the first metal electrode, an insulator layer of material, a second layer of magnetic material, and a second metal electrode in electrical communication with the second layer of magnetic material; and positioning a diffusion barrier layer between one of the first metal electrode and the first layer of magnetic material and between the second metal electrode and the second layer of magnetic material during the step of forming the stack of layers wherein the diffusion barrier layer is formed by exposing a metallization layer to ions or radicals or nitrogen.

37. A method of fabricating an MTJ cell as claimed in claim 36 wherein the step of positioning the diffusion barrier layer includes positioning a first diffusion barrier layer between the first metal electrode and the first layer of magnetic material and a second diffusion barrier layer between the second metal electrode and the second layer of magnetic material.

38. A method of fabricating an MTJ cell as claimed in claim 36 wherein the step of positioning the diffusion barrier layer includes forming the metallization layer between the first metal electrode and the first layer of magnetic material wherein the first metallization layer includes tantalum.

39. A method of fabricating an MTJ cell as claimed in claim 36 wherein the step of positioning the diffusion barrier layer includes forming the metallization layer between the second metal electrode and the second layer of magnetic material wherein the second metallization layer includes tantalum.

40. A method of fabricating an MTJ cell as claimed in claim 36 including in addition a step of heating to a temperature of at least 350° C.

41. A method of fabricating an MTJ cell as claimed in claim 38 wherein the step of forming the metallization layer with tantalum includes the steps of depositing a layer of tantalum with a thickness less than approximately 50Å.

42. A method of fabricating an MTJ cell as claimed in claim 39 wherein the step of forming the metallization layer with tantalum includes the steps of depositing a layer of tantalum with a thickness less than approximately 50Å.

43. A method of fabricating an MTJ cell as claimed in claim 36 wherein the step of positioning the diffusion barrier layer includes forming the diffusion barrier layer of material similar to the insulator layer and the diffusion barrier layer is formed thinner than the insulator layer.

44. An MTJ cell comprising:

a stack of layers of material including a first metal electrode, a first layer of magnetic material in electrical communication with the first metal electrode, an insulator layer of material, a second layer of magnetic material, and a second metal electrode in electrical communication with the second layer of magnetic material; and a diffusion barrier layer between one of the first metal electrode and the first layer of magnetic material and between the second metal electrode and the second layer of magnetic material wherein the diffusion barrier layer includes a metallization portion and a portion formed by exposing the metallization portion to ions or radicals.

45. An MTJ cell as claimed in claim 44 wherein the diffusion barrier layer includes tantalum.

46. An MTJ cell as claimed in claim 44 further including a first diffusion barrier layer between the first metal electrode and the first layer of magnetic material and a second diffusion barrier layer between the second metal electrode and the second layer of magnetic material.

47. An MTJ cell as claimed in claim 44 wherein the diffusion barrier layer includes material similar to the insulator layer material and the diffusion barrier layer is thinner than the insulator layer.

48. An MTJ cell as claimed in claim 47 wherein the diffusion barrier layer and the insulator layer include aluminum oxide.

49. An MTJ cell as claimed in claim 47 wherein the first layer of magnetic material includes a pair of layers of magnetic material antiferromagnetically coupled through a nonmagnetic spacer layer such that magnetic moments of the pair of layers are oriented substantially opposite in direction when no external magnetic field is applied.

50. An MTJ cell as claimed in claim 49 wherein the pair of layers of magnetic material each include CoFe alloy and the spacer layer has a thickness in a range of approximately 12 Å to 22Å.

* * * * *

UNITED STATES PATENT AND TRADEMARK OFFICE
CERTIFICATE OF CORRECTION

PATENT NO.   : 6,544,801 B1
DATED        : April 8, 2003
INVENTOR(S)  : Chen et al.

It is certified that error appears in the above-identified patent and that said Letters Patent is hereby corrected as shown below:

<u>Column 1,</u>
Line 3, please add the following paragraph:
-- This invention was made with Government support under Agreement No. MDA972-96-3-0016 awarded by DARPA. The Government has certain rights in the invention. --

Signed and Sealed this

Twenty-eighth Day of October, 2003

JAMES E. ROGAN
*Director of the United States Patent and Trademark Office*